United States Patent [19]

Komobuchi et al.

[11] Patent Number: 5,451,802
[45] Date of Patent: Sep. 19, 1995

[54] CHARGE TRANSFER DEVICE HAVING A HIGH-RESISTANCE ELECTRODE AND A LOW-RESISTANCE ELECTRODE

[75] Inventors: Hiroyoshi Komobuchi, Kyoto; Takao Kuroda, Ibaraki, both of Japan

[73] Assignee: Matsushita Electric Industrial Co., Ltd., Osaka, Japan

[21] Appl. No.: 145,347

[22] Filed: Oct. 29, 1993

[30] Foreign Application Priority Data

Oct. 29, 1992 [JP] Japan ................. 4-291071

[51] Int. Cl.⁶ .............................. H01L 29/78
[52] U.S. Cl. ................. 257/250; 257/241; 257/249
[58] Field of Search ............. 257/241, 249, 250

[56] References Cited

U.S. PATENT DOCUMENTS

| | | | |
|---|---|---|---|
| 3,836,409 | 9/1974 | Amelio et al. | 257/249 |
| 3,853,634 | 12/1974 | Amelio et al. | 257/249 |
| 3,943,545 | 3/1976 | Kim | 257/249 |
| 4,156,247 | 5/1979 | Hartman et al. | 257/249 |
| 4,206,372 | 6/1980 | Levine | 257/249 |
| 4,319,261 | 3/1982 | Kub | 257/249 |
| 4,910,569 | 3/1990 | Erhardt | 257/249 |

FOREIGN PATENT DOCUMENTS

| | | | |
|---|---|---|---|
| 52-10083 | 1/1977 | Japan | 257/250 |
| 62-104077 | 5/1987 | Japan | 257/241 |

Primary Examiner—Ngân V. Ngô
Attorney, Agent, or Firm—Ratner & Prestia

[57] ABSTRACT

A charge transfer device is provided, which includes: a semiconductor substrate having transfer regions for transferring a signal charge; an insulating film formed on the semiconductor substrate; an electrode layer formed above the transfer regions with the insulating film sandwiched therebetween, the electrode layer having high-resistant portions and low-resistant portions alternately provided; and voltage application means for applying a voltage for changing a surface potential of the transfer regions to the low-resistant portions of the electrode layer.

7 Claims, 9 Drawing Sheets

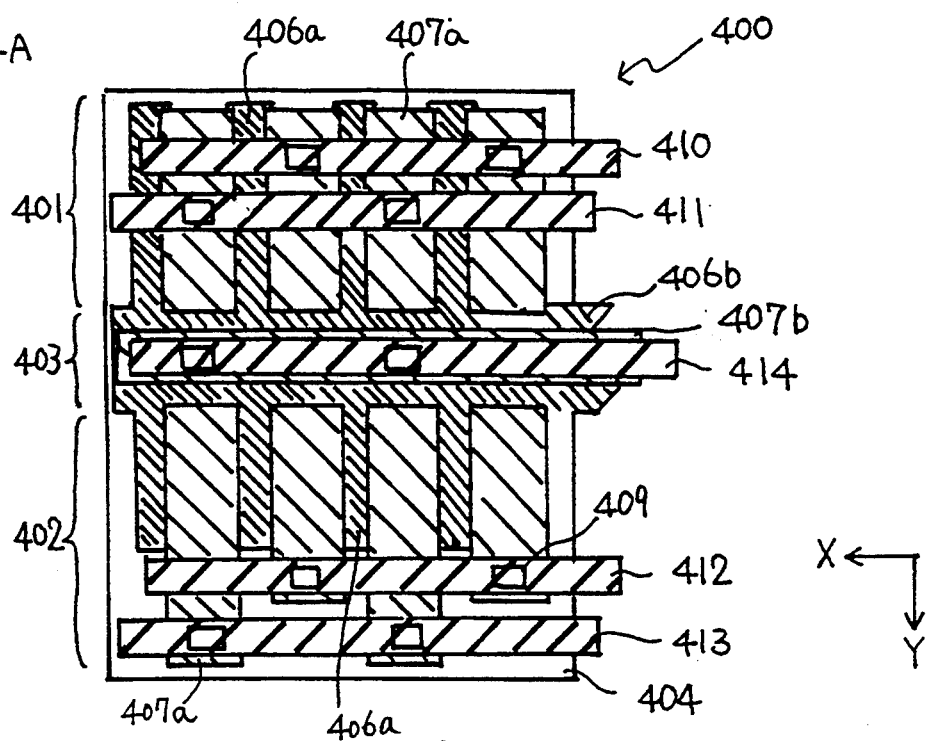
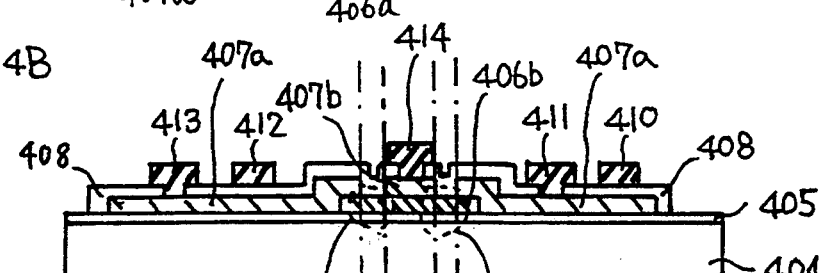
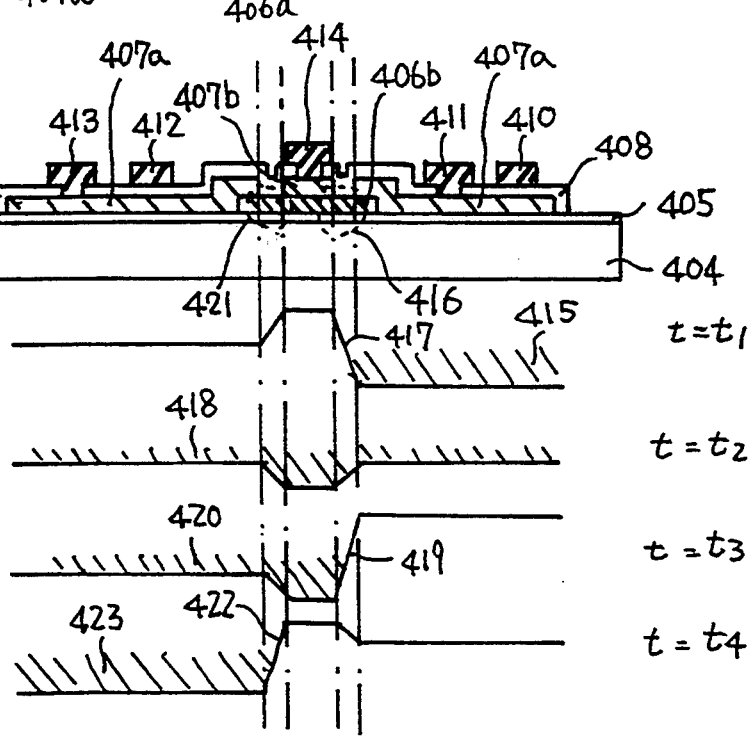

CHARGE TRANSFER DEVICE HAVING A HIGH-RESISTANCE ELECTRODE AND A LOW-RESISTANCE ELECTRODE

BACKGROUND OF THE INVENTION

1. Field of the Invention

The present invention relates to a charge transfer device used for a solid state imaging apparatus and the like.

2. Description of the Related Art

In the past, a horizontal transfer charge coupled device (HCCD) has been used for transferring a signal charge in a horizontal direction in a CCD-type solid state imaging device. The HCCD is driven by a two-phase clock using a double-layered polysilicon electrode. FIG. 7A is a cross-sectional view schematically showing a conventional HCCD 700 driven by a two-phase clock. FIG. 7B is a plan view thereof. The HCCD 700 includes an n-type semiconductor substrate 701, and first and second polysilicon electrodes 703 and 704 respectively formed on an insulating film 702 provided on the n-type semiconductor substrate 701. In the n-type semiconductor substrate 701, p-regions 705 are formed below the respective second polysilicon electrodes 704 so as to form a potential barrier. Each pair of the first polysilicon electrode 703 and the second polysilicon electrode 704 is electrically connected to a first wiring 708 and a second wiring 709 in an alternate manner through contact holes 707 which are formed in an insulating film (not shown) over the first and second polysilicon electrodes 703 and 704. A signal charge is transferred in the n-type semiconductor substrate 701 by applying two drive pulses (the phase of one pulse being different from that of the other pulse by 180 degrees) to the first wiring 708 and the second wiring 709, respectively.

As is shown in FIG. 7B, the first polysilicon electrode 703 and the second polysilicon electrode 704 have a width L1 and a width L2, respectively. For the purpose of efficiently transferring a signal charge, the minimum values min (L1) and min (L2) of the width L1 and the width L2 satisfy the following Equations (1) and (2):

$$min(L1) = X_{etch} + 2 \times X_{overlap-E} \quad (1)$$

$$min(L2) = X_{etch} + 2 \times X_{overlap-E} \quad (2)$$

where $X_{etch}$ is a minimum width of a polysilicon electrode to be etched, and $X_{overlap-E}$ is an overlapping width of adjacent polysilicon electrodes required for generating a fringing electrical field.

The first polysilicon electrode 703 and the second polysilicon electrode 704 are formed by a conventional method as is shown in FIGS. 8A to 8C. As is shown in FIG. 8A, the insulating film 702 is formed on the n-type semiconductor substrate 701. Then, the first polysilicon electrode 703 is formed on the insulating film 702. The surface of the first polysilicon electrode 703 is oxidized to form an oxide film 710 thereon. Then, the second polysilicon electrode 704 is formed on the insulating film 702 provided on the n-type semiconductor substrate 701 so as to partially overlap the first polysilicon electrode 703 by $X_{overlap-D}$. The surface of the second polysilicon electrode 704 is oxidized to form an oxide film 711 thereon.

Oxide film portions 712 and 713 are formed in a bird's beak shape in the vicinity of a connecting portion of the first polysilicon electrode 703 and the second polysilicon electrode 704. The formation of the oxide film 711 causes an end 714 of the second polysilicon electrode 704 to beturned up. As a result, the overlapping width of the first polysilicon electrode 703 and the second polysilicon electrode 704 is reduced by $\Delta X_{overlap}$ to be $X_{overlap-E}$. Thus, the turning up of the electrode should be considered in order to obtain the overlapping width sufficient for effectively generating a fringing electrical field. That is, the minimum value of the width L2 shown in FIG. 7B should satisfy the following Equation (3):

$$min(L2) = X_{etch} + 2 \times (X_{overlap-E} + \Delta X_{overlap}) \quad (3)$$

In order to highly integrate a charge transfer device, it is required that $\Delta X_{overlap}$ is nullified and $X_{overlap-E}$ is made as small as possible.

FIG. 9 partially shows a conventional charge transfer device 800 including a first HCCD 801, a second HCCD 802 and a transfer gate device 803 provided therebetween. The first HCCD 801, the second HCCD 802 and the transfer gate device 803 are positioned in parallel along an X direction. The first HCCD 801 and the second HCCD 802 respectively have first polysilicon electrodes 804 and second polysilicon electrodes 805. The transfer gate device 803 has a third polysilicon electrode 806. In order to transfer a signal charge from the first HCCD 801 to the second HCCD 802 in a Y direction, the first and second polysilicon electrodes 804 and 805 respectively overlap the third polysilicon electrode 806 by $Y_{overlap}$, whereby a fringing electrical field is generated. Thus, the charge transfer device 800 needs at least three polysilicon electrodes. The first polysilicon electrode 804 and the second polysilicon electrode 805 have a side in the Y direction longer than that in the X direction. Therefore, the charge transfer in the Y direction is inefficient. The reason for this is that the charge transfer efficiency depends upon the electrode length in the charge transfer direction.

SUMMARY OF THE INVENTION

The charge transfer device of this invention, includes: a semiconductor substrate having transfer regions for transferring a signal charge; an insulating film formed on the semiconductor substrate; an electrode layer formed above the transfer regions with the insulating film sandwiched therebetween, the electrode layer having high-resistant portions and low-resistant portions alternately provided; and voltage application unit for applying a voltage for changing a surface potential of the transfer regions to the low-resistant portions of the electrode layer.

According to another aspect of the present invention, a charge transfer device is provided. The charge transfer device includes: a semiconductor substrate; an insulating film formed on the semiconductor substrate; a first charge coupled device having a first transfer region formed in the semiconductor substrate, a first electrode layer formed above the first transfer region with the insulating film sandwiched therebetween, the first electrode layer including high-resistant portions and low-resistant portions alternately provided, and first voltage application means for applying a voltage for changing a surface potential of the first transfer region to the low-resistant portions of the first electrode layer; a second charge coupled device having a second transfer region formed in the semiconductor substrate, a second electrode layer formed above the second transfer region with the insulating film sandwiched therebetween, the second electrode layer having high-resistant portions and low-resistant portions alternately provided, and second voltage application means for applying a voltage for changing a surface potential of the second transfer region to the low-resistant portions of the second electrode layer; and a transfer gate device for transferring a signal charge from the first charge coupled device to the second charge coupled device, having: a transfer gate region formed between the first and second transfer regions in the semiconductor substrate; a transfer gate electrode having high resistance, the transfer gate electrode being formed above the transfer gate region with the insulating film sandwiched there-between and being electrically connected to the low-resistant portions of the first and second electrode layers; and transfer gate voltage application means for applying a voltage for changing a surface potential of the gate transfer region to the gate transfer region.

Thus, the invention described herein makes possible the advantages of (1) providing a charge transfer device having a small overlapping width of transfer electrodes; (2) providing a charge transfer device having multi-channels formed of a double-layered electrode; and (3) providing a charge transfer device which can be fabricated in a simplified process, is highly integrated, and has high charge transfer efficiency between channels.

These and other advantages of the present invention will become apparent to those skilled in the art upon reading and understanding the following detailed description with reference to the accompanying figures.

BRIEF DESCRIPTION OF THE DRAWINGS

FIG. 4A is a plan view showing a charge transfer device of the third example according to the present invention.

FIG. 4B is a cross-sectional view showing the charge transfer device of the third example according to the present invention.

FIG. 4C is a surface potential view illustrating the operation of the charge transfer device of the third example according to the present invention.

DESCRIPTION OF THE PREFERRED EMBODIMENTS

The present invention will be described by way of illustrative examples with reference to the drawings.

Figure 1A:
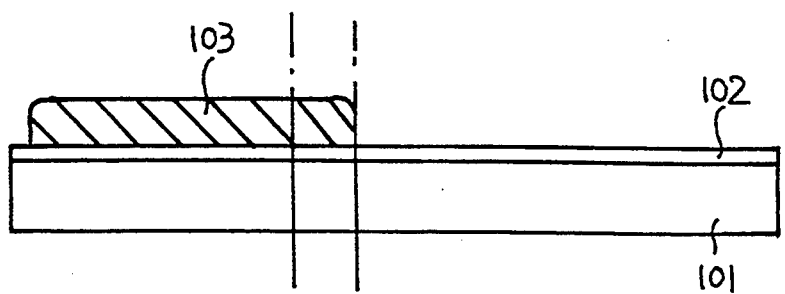
FIGS. 1A to 1C are cross-sectional views illustrating the structure of transfer electrodes used for a charge transfer device according to the present invention and a method for producing the same.
Figure 1B:
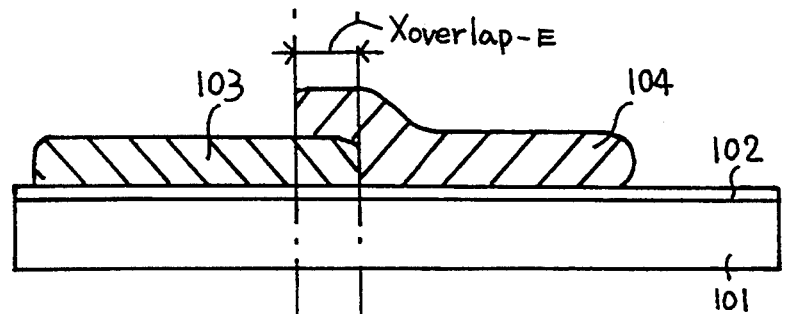
Figure 1C:
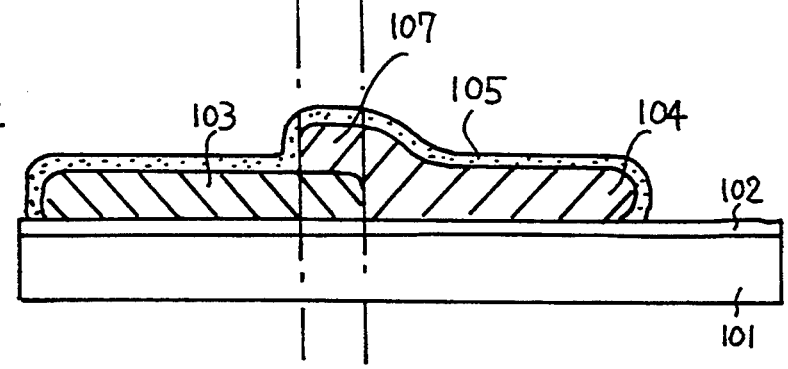

Referring to FIGS. 1A to 1C, the structure of transfer electrodes used for a charge transfer device according to the present invention and a method for producing the same will be described.

As is shown in FIG. 1A, an insulating film 102 is formed on a semiconductor substrate 101, and then a first electrode 103 made of polysilicon is formed on the insulating film 102. The first electrode 103 has a high resistance of preferably 10 k$\Omega$/square or more and, more preferably 100 k$\Omega$/square or more. As is shown in FIG. 1B, a second electrode 104 made of polysilicon is formed on the insulating film 102 so as to partially overlap the first electrode 103 by $X_{overlap\text{-}E}$. The second electrode 104 has a low resistance of preferably 20 $\Omega$/square or less, and more preferably about 10 $\Omega$/square. Polysilicon with low resistance is prepared by adding phosphorus such as $POCl_3$ to polysilicon. As is shown in FIG. 1C, the surfaces of the first electrode 103 and the second electrode 104 are oxidized to form an oxide film 105 thereon. It is preferred that the thickness of the oxide film 105 is set so as to withstand dielectric breakdown, when applied with a drive voltage. Preferred thickness thereof is about 10 nm.

According to the above-mentioned method, it is not necessary to oxidize the surface of the first electrode 103 after being formed. Therefore, an oxide film portion in a bird's beak shape is not formed in a connecting portion of the first electrode 103 and the second electrode 104, and an end 107 of the second electrode 104 is not turned up. Consequently, an overlapping width $X_{overlap\text{-}E}$ is not reduced, and it is not necessary to consider the turning up of the second electrode 104 when determining the overlapping width. In addition, an oxidizing step is used only once, so that the diffusion of the impurity regions formed in the semiconductor substrate 101 in a lateral direction can be reduced. Thus, the charge transfer device can be highly integrated.

EXAMPLE 1

Figure 2A:
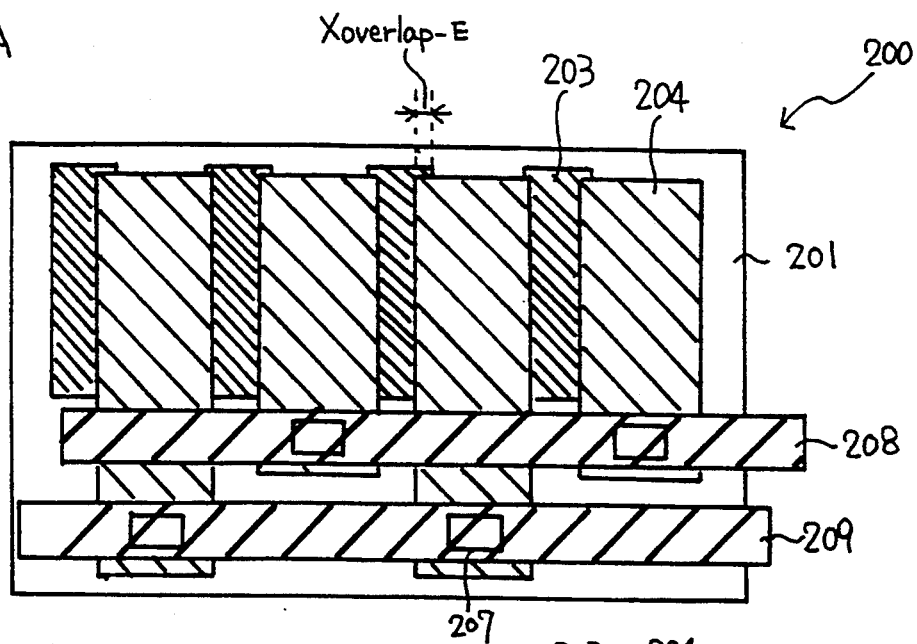
FIG. 2A is a plan view showing a charge transfer device of the first example according to the present invention.
Figure 2B:
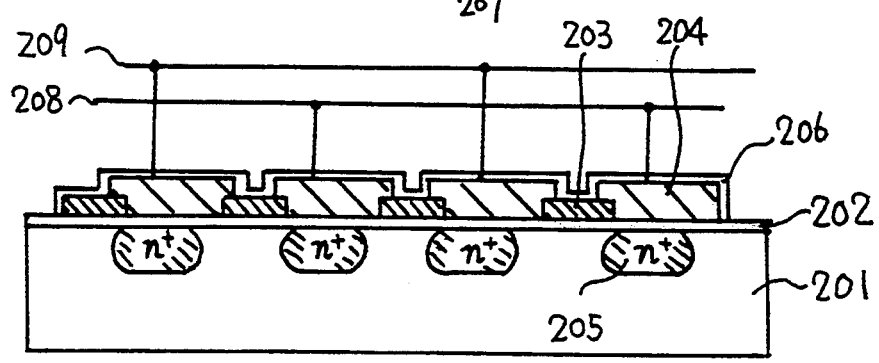
FIG. 2B is a cross-sectional view showing the charge transfer device of the first example according to the present invention.

Referring to FIGS. 2A and 2B, a charge transfer device 200 according to the present invention will be described.

An insulating film 202 is formed on an n-type semiconductor substrate 201. A plurality of first electrodes 203 are formed on the insulating film 202, respectively at a predetermined distance. The first electrodes 203 have a sheet resistance of about 100 kΩ/square. Between the respective adjacent first electrodes 203, second electrodes 204 are formed. The second electrodes 204 have a sheet resistance of about 10 Ω/square. The respective second electrodes 204 overlap the two adjacent first electrodes 203 by $X_{overlap-E}$. In the n-type semiconductor substrate 201, n+-regions 205 are formed below the respective second electrodes 204. The n+-regions 205 and a part of the n-type semiconductor substrate 201 form charge transfer regions. An oxide film 206 is formed on the surfaces of the first electrodes 203 and the second electrodes 204. The two adjacent second electrodes 204 are electrically connected to the wiring 208 and wiring 209, respectively, through contact holes 207 formed in the oxide film 206. The wirings 208 and 209 are made of metal having low resistance such as aluminum. Driving voltages are applied to the second electrodes 204 having low resistances through the wirings 208 and 209.

The charge transfer device 200 is produced as follows:

First, the insulating film 202 is formed on the n-type semiconductor substrate 201. Then, the first electrodes 203 made of polysilicon having a sheet resistance of about 100 kΩ/square are formed on the insulating film 202. N-type impurities are implanted into the n-type semiconductor substrate 201 so as to be self-aligned with respect to the first electrodes 203, thereby forming n+-regions 205. The second electrodes 204 made of polysilicon having a sheet resistance of about 10 Ω/square are formed so as to respectively overlap two adjacent first electrodes 203 by $X_{overlap-E}$. The surfaces of the first electrodes 203 and the second electrodes 204 are oxidized to form the oxide film 206. Contact holes 207 are formed in the oxide film 206, and then the wirings 208 and 209 made of aluminum are formed.

Figure 2C:
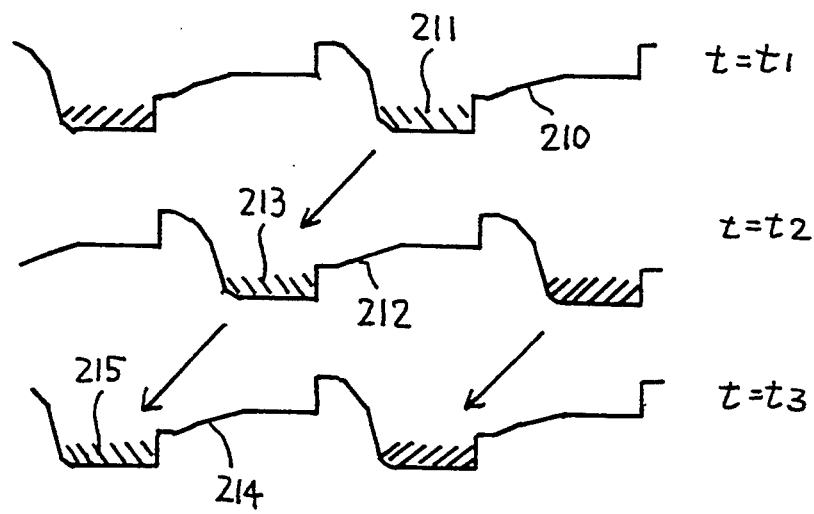
FIG. 2C is a surface potential view illustrating the operation of the charge transfer device of the first example according to the present invention.

Referring to FIG. 2C, the operation of the charge transfer device 200 will be described. The charge transfer device 200 is driven by a conventional method for driving a CCD-type solid state imaging apparatus.

Firstly, when a drive voltage of 5 V is applied to the wiring 209 and a drive voltage of 0 V is applied to the wiring 208, a surface potential of the n-type semiconductor substrate 201 is in a state shown by t=t1. Each of the first electrodes 203 is electrically connected to the two adjacent second electrodes 204, so that the sides of the first electrode 203 are respectively applied with voltages of 5 V and 0 V. Thus, an electrical potential bias is caused inside the first electrode 203. This electrical potential bias causes a surface potential gradient 210 in a portion of the n-type semiconductor substrate 201 below the first electrode 203. As a result, a signal charge 211 is stored in the portion of the n-type semiconductor substrate 201 below the second electrode 204 which is applied with a drive voltage of 5 V.

Secondly, when a drive voltage of 0 V is applied to the wiring 209 and a drive voltage of 5 V is applied to the wiring 208, the surface potential of the n-type semiconductor substrate 201 is in a state shown by t=t2. The second electrode 204 which is positioned above the stored signal charge 211 is applied with a drive voltage of 0 V, causing a surface potential gradient 212. The signal charge 211 is smoothly transferred to a portion of the n-type semiconductor substrate 201 below the adjacent second electrode 204 by the surface potential gradient 212, resulting in a stored signal charge 213.

Thirdly, when a drive voltage of 5 V is applied to the wiring 209 and a drive voltage of 0 V is applied to the wiring 208, the surface potential of the n-type semiconductor substrate 201 is in a state shown by t=t3. Likewise, the second electrode 204 which is positioned above the stored signal charge 213 is applied with a drive voltage of 0 V, causing a surface potential gradient 214. The signal charge 213 is smoothly transferred to a portion of the n-type semiconductor substrate 201 below the adjacent second electrode 204 by the surface potential gradient 214, resulting in a stored signal charge 215. In this way, by alternately applying two drive voltages to the wirings 208 and 209, a signal charge is smoothly transferred in the n-type semiconductor substrate 201.

As described above, the first electrode 203 is electrically connected to the two adjacent second electrodes 204, so that two different voltages are applied to the respective connecting sides of the first electrode 203. The first electrode 203 has high resistance. Because of this, a smooth electrical potential bias is formed in the first electrode 203 due to an internal voltage drop. The smooth electrical potential bias causes a smooth surface potential gradient in the portion of the n-type semiconductor substrate 201 below the first electrode 203. Therefore, a signal charge can be smoothly transferred in the n-type semiconductor substrate 201 without decreasing the transfer efficiency. The respective second electrodes 204 are electrically connected to each other through the respective first electrodes 203. Thus, the first electrodes 203 and the second electrodes 204 can be considered as one electrode layer having high-resistant portions and low-resistant portions.

In the course of the production of the charge transfer device 200, an oxide film of about 1 nm may be naturally formed on the first electrode 203 after the formation of the first electrode 203. This means that a naturally formed oxide film may be provided between the first electrode 203 and the second electrode 204. However, such a naturally formed oxide film is broken by a drive voltage applied to the electrodes, and the first electrode 203 and the second electrode 204 are electrically connected to each other. Thus, there is no problem even though the first electrode 203 or the second electrode 204 is provided with such a naturally formed oxide film in the charge transfer device 200.

EXAMPLE 2

Figure 3A:
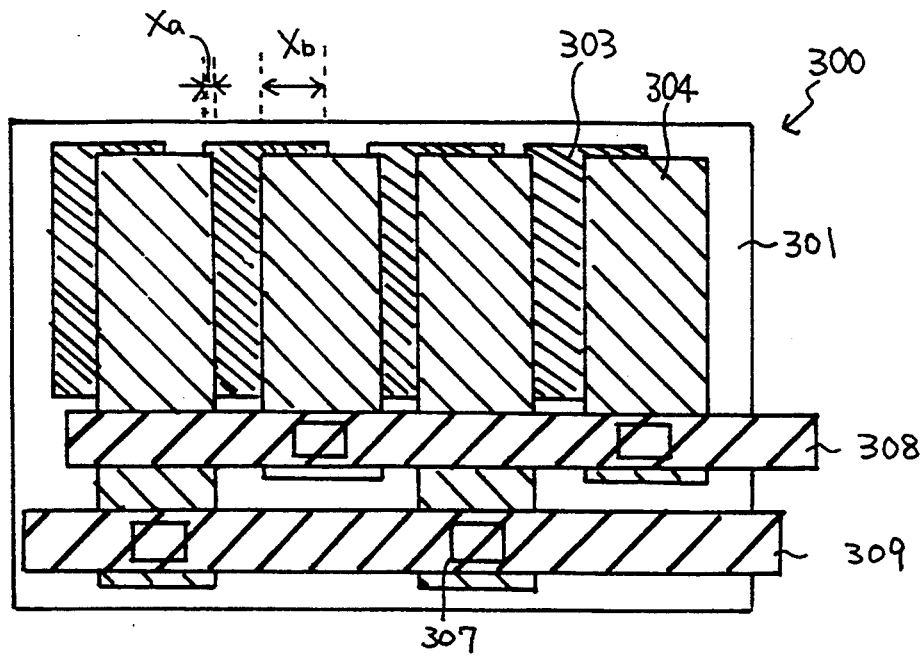
FIG. 3A is a plan view showing a charge transfer device of the second example according to the present invention.
Figure 3B:
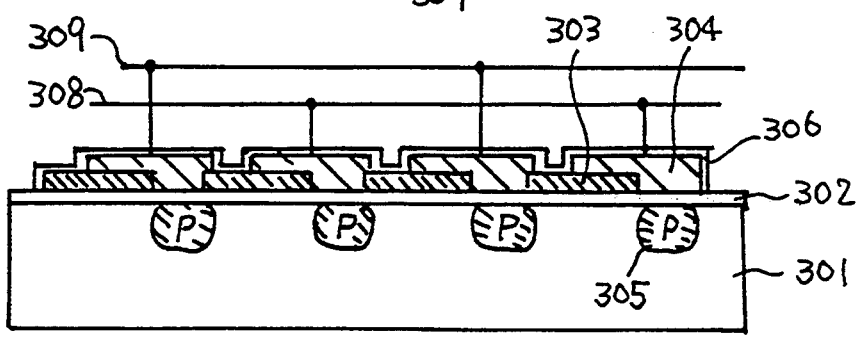
FIG. 3B is a cross-sectional view showing the charge transfer device of the second example according to the present invention.

Referring to FIGS. 3A and 3B, the charge transfer device 300 according to the present invention will be described.

An insulating film 302 is formed on an n-type semiconductor substrate 301. A plurality of first electrodes 303 are formed on the insulating film 302, respectively at a predetermined distance. The first electrodes 303 have a sheet resistance of about 100 kΩ/square. Between the respective adjacent first electrodes 303, the second electrodes 304 are formed. The second electrodes 304 have a sheet resistance of about 10 Ω/square. The respective second electrodes 304 overlap the two adjacent first electrodes 303 by $X_a$ and $X_b$. In the n-type semiconductor substrate 301, p-regions 305 are formed below the respective second electrodes 304. The p-regions 305 and a part of the n-type semiconductor substrate 301 form charge transfer regions. An oxide film 306 is formed on the surfaces of the first electrodes 303 and the second electrodes 304. The two adjacent second electrodes 304 are electrically connected to the wiring 308 and wiring 309, respectively, through contact holes 307 formed in the oxide film 306. The wirings 308 and 309 are made of metal having low resistance such as aluminum. Driving voltages are applied to the second electrodes 304 having low resistances through the wirings 308 and 309.

The charge transfer device 300 is produced in the same way as in Example 1.

First, the insulating film 302 is formed on the n-type semiconductor substrate 301. Then, the first electrodes 303 made of polysilicon having a sheet resistance of 100 k$\Omega$/square are formed on the insulating film 302. P-type impurities are implanted into the n-type semiconductor substrate 301 so as to be self-aligned with respect to the first electrodes 303, thereby forming p-regions 305. The second electrodes 304 made of polysilicon having a sheet resistance of 10 $\Omega$/square are formed so as to respectively overlap two adjacent first electrodes 303 by $X_a$ and $X_b$. The surfaces of the first electrodes 303 and the second electrodes 304 are oxidized to form the oxide film 306. Contact holes 307 are formed in the oxide film 306, and then the wirings 308 and 309 made of aluminum are formed.

Figure 3C:
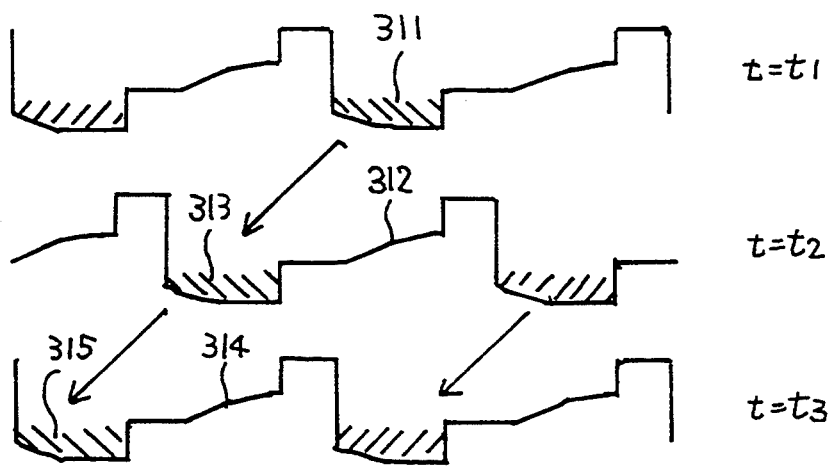
FIG. 3C is a surface potential view illustrating the operation of the charge transfer device of the second example according to the present invention.

Referring to FIG. 3C, the operation of the charge transfer device 300 will be described. The charge transfer device 300 is driven by a conventional method for driving a CCD-type solid state imaging apparatus.

Firstly, when a drive voltage of 5 V is applied to the wiring 309 and a drive voltage of 0 V is applied to the wiring 308, a surface potential of the n-type semiconductor substrate 301 is in a state shown by t=t1. Each of the first electrodes 303 is electrically connected to the two adjacent second electrodes 304, so that the sides of the first electrode 303 are respectively applied with voltages of 5 V and 0 V. Thus, an electrical potential bias is caused inside the first electrode 303. As a result, a signal charge 311 is stored in a portion of the n-type semiconductor substrate 301 below the first electrode 303 overlapping the second electrode 304, which is applied with a drive voltage of 5 V, by $X_b$.

Secondly, when a drive voltage of 0 V is applied to the wiring 309 and a drive voltage of 5 V is applied to the wiring 308, the surface potential of the n-type semiconductor substrate 301 is in a state shown by t=t2. The second electrode 304 which is positioned above the stored signal charge 311 is applied with a drive voltage of 0 V, causing a surface potential gradient 312. The signal charge 311 is smoothly transferred to a portion of the n-type semiconductor substrate 301 below the adjacent first electrode 303 (overlapping the second electrode 304, which is applied with a drive voltage of 5 V, by $X_b$) by the surface potential gradient 312, resulting in a stored signal charge 313.

Thirdly, when a drive voltage of 5 V is applied to the wiring 309 and a drive voltage of 0 V is applied to the wiring 308, the surface potential of the n-type semiconductor substrate 301 is in a state shown by t=t3. Likewise, the second electrode 304 which is positioned above the stored signal charge 313 is applied with a drive voltage of 0 V, causing a surface potential gradient 314. The signal charge 313 is smoothly transferred to a portion of the n-type semiconductor substrate 301 below the adjacent first electrode 303 (overlapping the second electrode 304, which is applied with a drive voltage of 5 V, by $X_b$) by the surface potential gradient 314, resulting in a stored signal charge 315. In this way, by alternately applying two drive voltages to the wirings 308 and 309, a signal charge is smoothly transferred in the n-type semiconductor substrate 301.

EXAMPLE 3

Referring to FIGS. 4A and 4B, a charge transfer device 400 according to the present invention will be described.

The charge transfer device 400 includes a first charge coupled device (CCD) 401, a second CCD 402, and a transfer gate device 403 provided between the first CCD 401 and the second CCD 402. The first CCD 401 and the second CCD 402 have substantially the same structure as that of the charge transfer device 200 shown in FIGS. 2A and 2B.

An insulating film 405 is formed on an n-type semiconductor substrate 404. As is explained in FIGS. 2B or 3B, two charge transfer regions (not shown for clarification) consisting of n+-regions and a part of the n-type semiconductor substrate 404, or p-regions and a part of the n-type semiconductor substrate 404 are formed in parts the n-type semiconductor substrate 404. First electrodes 406a and 406b are formed on the insulating film 405. The first electrodes 406a are formed on the insulating film 405 in a stripe shape in a Y direction, and are positioned above the two charge transfer regions. Another first electrode 406b is formed so as to cross the first electrodes 406a. The first electrodes 406a and 406b are made of polysilicon and have a sheet resistance of about 100 k$\Omega$/square. Second electrodes 407a are formed on the insulating film 405. The second electrodes 407a partially overlap the first electrodes 406a. On the first electrode 406b, a second electrode 407b is formed. The second electrodes 407a and 407b are made of polysilicon and have a sheet resistance of about 10 $\Omega$/square. An insulating film 408 is formed on the first electrodes 406a and 406b and the second electrodes 407a and 407b. In the first CCD 401, the second electrodes 407a are electrically connected to the wiring 410 and wiring 411, respectively, through contact holes 409 formed in the insulating film 408. Likewise, in the second CCD 402, the second electrodes 407a are electrically connected to the wiring 412 and wiring 413, respectively, through the contact holes 409 formed in the insulating film 408. The second electrode 407b is electrically connected to the wiring 414 through the contact holes 409.

The charge transfer device 400 is produced by the same method for producing the charge transfer device 200 in Example 1.

The operation of the charge transfer device 400 will be described.

A method for transferring a signal charge in an X direction by using the first and second CCDs 401 and 402 is the same as that in Example 1. Therefore, the description thereof is omitted. Here, the transfer of a signal charge from the first CCD 401 to the second CCD 402 will be described with reference to FIGS. 4B and 4C.

Firstly, when drive voltages of 5 V, −5 V, and 0 V are applied to the wirings 411, 414, and 413, respectively, a surface potential in the n-type semiconductor substrate 404 is in the state shown by t=t1. The second electrodes 407a of the first CCD 401 are applied with a drive voltage of 5 V via the wiring 411, forming a surface potential in the n-type semiconductor substrate 404, whereby a signal charge 415 is stored in the n-type semiconductor substrate 404 below the second electrodes 407a. The first electrode 406b is electrically connected to the second electrodes 407a applied with a drive voltage of 5 V and to the second electrode 407b applied with a drive voltage of −5 V, so that an electrical potential bias is caused in a region 416 of the first electrode 406b. This electrical potential bias causes a surface potential gradient 417 in the n-type semiconductor substrate 404.

Secondly, when drive voltages of 5 V, 10 V, and 5 V are applied to the wirings 411, 414, and 413, respectively, the surface potential of the n-type semiconductor substrate 404 is in a state shown by t=t2. Due to the change in the surface potential of the n-type semiconductor substrate 404, a signal charge 418 flows into the second CCD 402.

Thirdly, when drive voltages of 0 V, 10 V, and 5 V are applied to the wirings 411, 414, and 413, the surface potential of the n-type semiconductor substrate 404 is in a state shown by t=t3. An electrical potential bias caused in the region 416 of the first electrode 406b causes a surface potential gradient 419 in the n-type semiconductor substrate 404. Consequently, the signal charge stored in the first CCD 401 is completely transferred to the transfer gate device 403 and the second CCD 402, resulting in a stored signal charge 420.

Finally, when drive voltages of 0 V, −5 V, and 5 V are applied to the wirings 411, 414, and 413, the surface potential of the n-type semiconductor substrate 404 is in a state shown by t=t4. An electrical potential bias caused in a region 421 of the first electrode 406b causes a surface potential gradient 422 in the n-type semiconductor substrate 404. Consequently, the signal charge stored in the transfer gate device 403 is completely transferred to the second CCD 402, resulting in a stored signal charge 423.

EXAMPLE 4

Figure 5A:
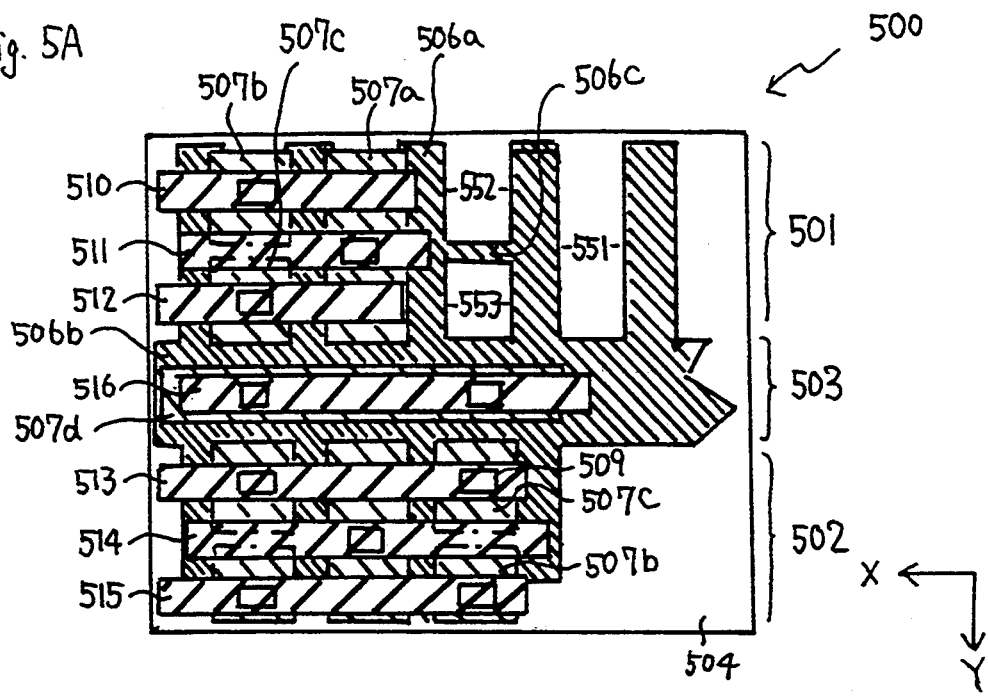
FIG. 5A is a plan view showing a charge transfer device of the fourth example according to the present invention.

Referring to FIG. 5A, a charge transfer device 500 according to the present invention will be described.

The charge transfer device 500 includes a first CCD 501, a second CCD 502, and a transfer gate device 503 provided between the first CCD 501 and the second CCD 502. An insulating film 505 is formed on an n-type semiconductor substrate 504. As is explained in FIG. 2B or 3B, two charge transfer regions (not shown for clarification) consisting of n+-regions and a part of the n-type semiconductor substrate 504, or p-regions and a part of the n-type semiconductor substrate 504 are formed in parts the n-type semiconductor substrate 504. First electrodes 506a, 506b, and 506c are formed on the insulating film 505. The first electrodes 506a extending in a Y direction are formed on the insulating film 505 in a stripe shape. The first electrode 506b extending in an X direction is formed on the insulating film 505 so as to cross the first electrodes 506a. Regions 551 of the insulating film 505 are defined by the first electrodes 506a and 506b. The first electrodes 506c extend in the X direction to divide each alternate region 551 of the insulating film 505 into portions 552 and 553. The regions 551 and the portions 552 and 553 of the insulating film 505 are positioned above the two charge transfer regions. The first electrodes 506a, 506b, and 506c are made of polysilicon and have a sheet resistance of about 100 kΩ/square.

Second electrodes 507a are respectively formed on each region 551 which is not divided into the portions 552 and 553. Each of the second electrodes 507a partially overlaps the first electrodes 506a and 506b. Second electrodes 507b and 507c are formed on the portions 552 and 553, respectively. Each of the second electrodes 507b partially overlaps the first electrodes 506a and 506c. Each of the second electrodes 507c partially overlaps the first electrodes 506a, 506b, and 506c.

On the first electrode 506b, a second electrode 507d is formed. The second electrodes 507a, 507b, 507c, and 507d are made of polysilicon and have a sheet resistance of about 10 Ω/square. An insulating film 508 is formed on the first electrodes 506a, 506b, and 506c and on the second electrodes 507a, 507b, 507c, and 507d. The second electrodes 507a, 507b, 507c, and 507d are electrically connected to wirings 510, 511, 512, 513, 514, 515, and 516 through contact holes 509 formed in the insulating film 508.

The charge transfer device 500 is different from the charge transfer device 400 in Example 3 in the structure in which each alternate second electrode is divided.

The operation of the charge transfer device 500 will be described.

Figure 5B:
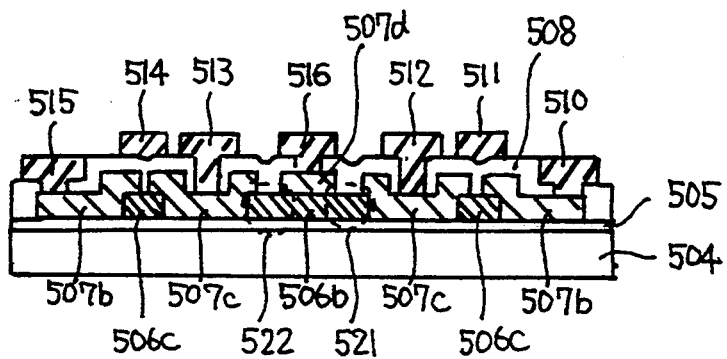
FIG. 5B is a cross-sectional view showing the charge transfer device of the fourth example according to the present invention.
Figure 5C:
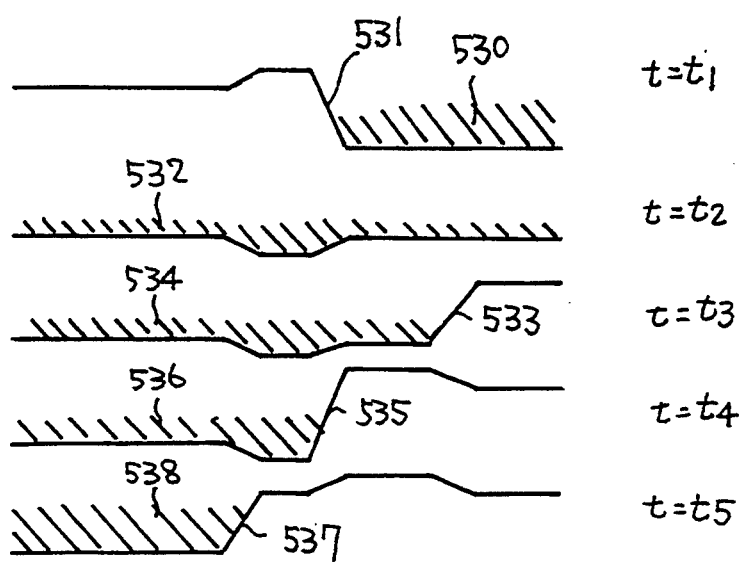
FIG. 5C is a surface potential view illustrating the operation of the charge transfer device of the fourth example according to the present invention.

The same drive voltage is applied to the wirings 510, 512, 513, and 515 so that a signal charge is transferred in the X direction by using the first and second CCDs 501 and 502. Because of this, the second electrodes 507b and 507c work as one electrode. In this way, a signal charge can be transferred by the same method as that in Example 1. The transfer of a signal charge from the first CCD 501 to the second CCD 502 will be described with reference to FIGS. 5B and 5C.

Firstly, when drive voltages of 5 V, 5 V, −5 V, 0 V, and 0 V are applied to the wirings 510, 512, 516, 513, and 515, respectively, a surface potential of the n-type semiconductor substrate 504 is in a state shown by t=t1. In the first CCD 501, the second electrodes 507b and 507c are applied with a drive voltage of 5 V to form a surface potential in the n-type semiconductor substrate 504, whereby a signal charge 530 is stored. The first electrode 506b is electrically connected to the second electrode 507c applied with a drive voltage of 5 V and to the second electrode 507d applied with a drive voltage of −5 V, so that an electrical potential bias is caused in a region 521 of the first electrode 506b. This surface potential bias causes an electrical potential gradient 531 in the n-type semiconductor substrate 504.

Secondly, when drive voltages of 5 V, 5 V, 10 V, 5 V, and 5 V are applied to the wirings 510, 512, 516, 513, and 515, respectively, a surface potential of the n-type semiconductor substrate 504 is in a state shown by t=t2. Due to the change in the surface potential of the n-type semiconductor substrate 504, a signal charge 532 flows into the second CCD 502.

Thirdly, when drive voltages of 0 V, 5 V, 10 V, 5 V, and 5 V are applied to the wirings 510, 512, 516, 513, and 515, respectively, the surface potential of the n-type semiconductor substrate 504 is in a state shown by t=t3.

The electrical potential bias caused in the region 521 of the first electrodes 506c causes an electrical potential bias 533. Consequently, the signal charge stored below the second electrode 507b of the first CCD 501 is completely transferred to the second electrodes 507c, the transfer gate device 503, and the second CCD 502, resulting in a stored signal charge 534.

Fourthly, when drive voltages of 0 V, −5 V, 10 V, 5 V, and 5 V are applied to the wirings 510, 512, 516, 513, and 515, respectively, the surface potential of the n-type semiconductor substrate 504 is in a state shown by t=t4. An electrical potential bias caused in the region 521 of the first electrode 506b causes a surface potential gradient 535. Consequently, the signal charge stored in the first CCD 501 is completely transferred to the transfer gate device 503 and the second CCD 502, resulting in a stored signal charge 536.

Finally, when drive voltages of 0 V, −5 V, 0 V, −5 V, and −5 V are applied to the wirings 510, 512, 516, 513, and 515, respectively, the surface potential of the n-type semiconductor substrate 504 is in a state shown by t=t5. An electrical potential bias caused in a region 522 of the first electrode 506b causes a surface potential gradient 537. Consequently, the signal charge stored in the transfer gate device 503 is transferred to the second CCD 502, resulting in a stored signal charge 538.

As described above, in the charge transfer device 500, since each alternate second electrode of the first CCD 501 is divided into two portions and respectively driven at different periods, transfer efficiency can be improved compared with the case where one electrode is used for the transfer of a signal charge. In the present example, each alternate second electrode is divided into two portions. However, the dividing number is not limited to two, and each alternate second electrode can be divided to any length.

EXAMPLE 5

Figure 6A:
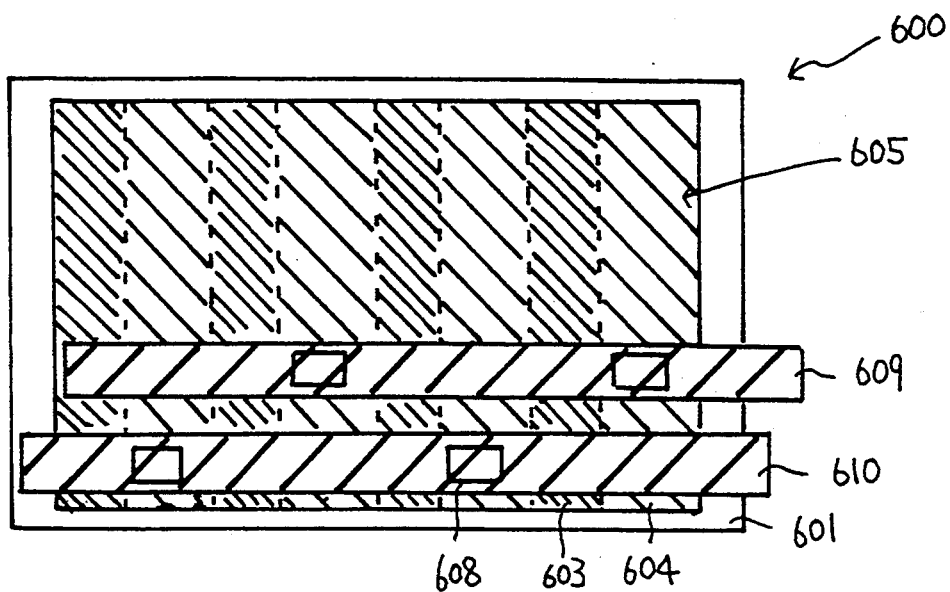
FIG. 6A is a plan view showing a charge transfer device of the fifth example according to the present invention.
Figure 6B:
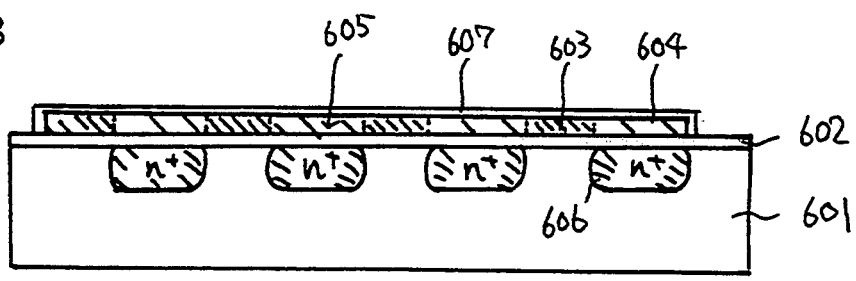
FIG. 6B is a cross-sectional view showing the charge transfer device of the fifth example of the present invention.
Figure 7A:
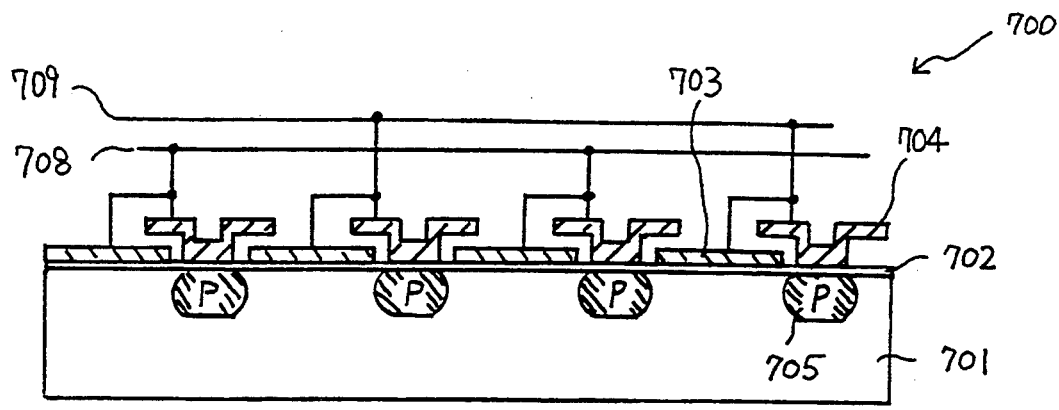
FIG. 7A is a cross-sectional view showing a conventional charge transfer device.
Figure 7B:
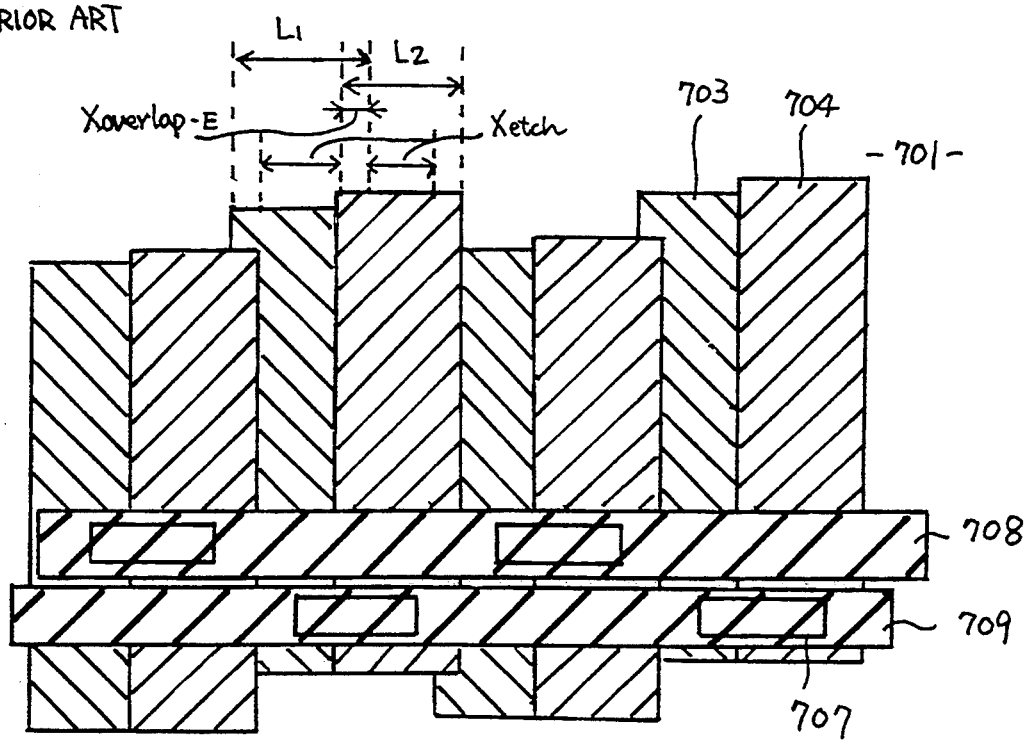
FIG. 7B is a plan view showing the conventional charge transfer device.
Figure 8A:
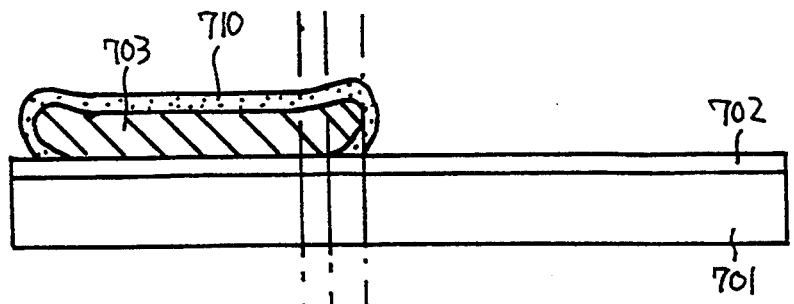
FIGS. 8A to 8C are cross-sectional views illustrating the structure of charge transfer electrodes used for the conventional charge transfer device and a method for producing the same.
Figure 8B:
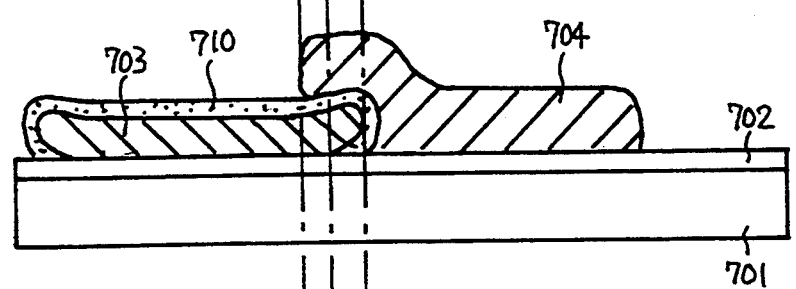
Figure 8C:
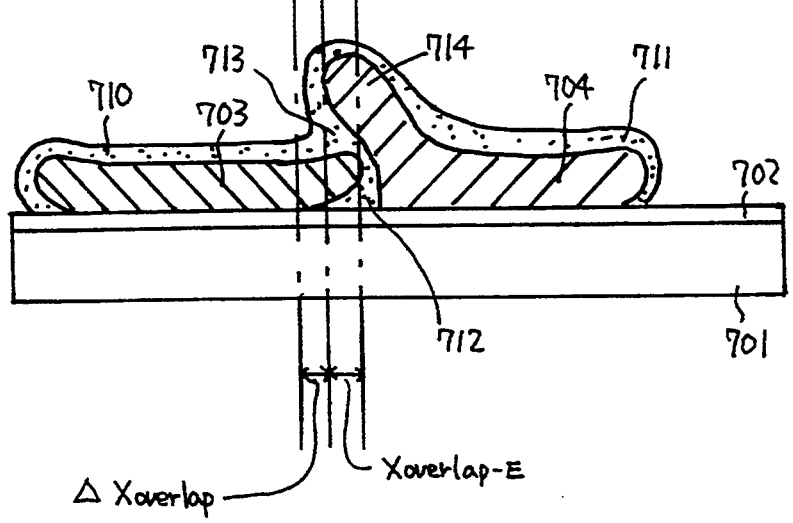
Figure 9:
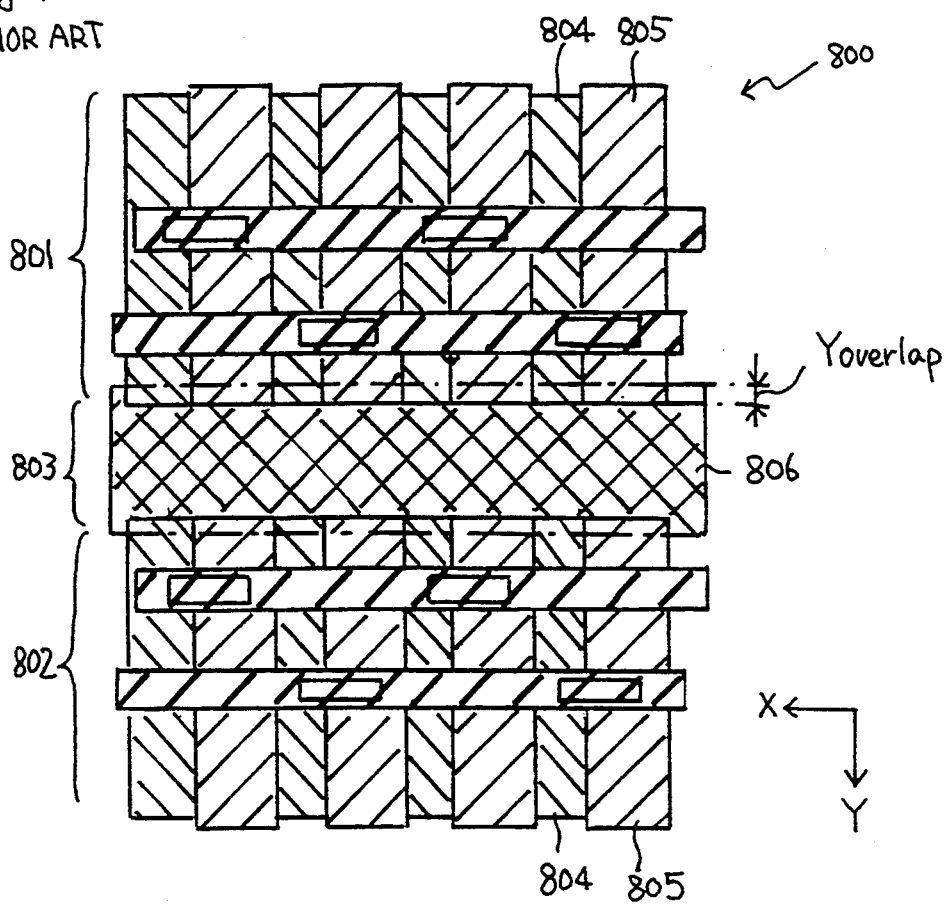
FIG. 9 is a plan view showing another conventional charge transfer device.

Referring to FIGS. 6A and 6B, a charge transfer device 600 will be described.

An insulating film 602 is formed on an n-type semiconductor substrate 601. An electrode layer 605 made of polysilicon is formed on the insulating film 602. The electrode layer 605 includes high-resistant portions 603 and low-resistant portions 604 formed in a stripe shape. The high-resistant portions 603 preferably have a resistance of not less than 10 k$\Omega$/square, and more preferably not less than 100 k$\Omega$/square. The low-resistance portions 604 have a resistance of not more than 20 $\Omega$/square, and more preferably about 10 $\Omega$/square. In the n-type semiconductor substrate 601, n+-regions 606 are formed below the respective low-resistant portions 604. The n+-regions 606 and a part of the n-type semiconductor substrate 601 form charge transfer regions. An oxide film 607 is formed on the electrode layer 605. Each alternate low-resistant portion 604 is electrically connected to a wiring 609 and a wiring 610, respectively through contact holes 608 formed in the oxide film 607.

Hereinafter, a method for producing the charge transfer device 600 will be described.

The insulating film 602 is formed on the n-type semiconductor substrate 601. Then, the electrode layer 605 is formed on the insulating film 602. The electrode layer 605 is made of polysilicon has a sheet resistance of about 100 k$\Omega$/square. A resist pattern (not shown) is formed so as to cover the portions corresponding to the high-resistant portions 603, and then n-type impurity ions are implanted through the electrode layer 605 into the n-type semiconductor substrate 601, thereby forming the n+-regions 606 in the n-type semiconductor substrate 601. Then, phosphorus ions are implanted into the electrode layer 605 to form the low-resistant portions 604 therein. The low-resistant portions 604 have a sheet resistant of about 10 $\Omega$/square. The resist pattern is removed. Consequently, the electrode layer 605 having the high-resistant portions 603 and the low-resistant portions 604 is formed. The surface of the electrode layer 605 is oxidized to form an oxide film 607. The contact holes 608 are formed in the oxide film 607 and the wirings 609 and 610 are formed.

The charge transfer device 600 is driven by the same method for driving the charge transfer device 200 in Example 1. The charge transfer device 600 can be conveniently used in the case where it is not required to use a fringing electrical field caused by the overlapping of the transfer electrodes. Since the high-resistant portions 603 and the low-resistant portions 604 can be formed by the ion implantation, the charge transfer device 600 can be fabricated by using substantially one electrode. Thus, the production process is remarkably simplified. In addition, since the n+-regions 606 in the transfer regions and the low-resistant portions 604 can be formed by using only a resist pattern defining the low-resistant portions 604, the overlapping error can be decreased, improving the yield and reliability of the device.

As described in Examples 1 to 5, the charge transfer device according to the present invention is characterized by a voltage to be applied for changing the surface potential in the signal charge transfer regions. A voltage having an electrical potential bias is applied to the charge transfer regions.

In Examples 1 to 5, polysilicon is used as materials for the first and second electrodes; however, ITO (indium tin oxide) and the like can be used. Moreover, the first electrode having low-resistance and the second electrode having high-resistance can be used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A charge transfer device comprising:
   a semiconductor substrate having a transfer region for transferring a signal charge;
   an insulating film formed on said semiconductor substrate;
   a plurality of first electrodes having a high resistance and formed above said transfer region with said insulating film sandwiched therebetween, said plurality of first electrodes being respectively disposed at a predetermined distance;
   a plurality of second electrodes having a low resistance and formed above said transfer region with said insulating film sandwiched therebetween, each of said second electrodes being disposed between said respective adjacent first electrodes and partially overlapping said respective adjacent first electrodes with direct contact; and
   voltage application means for applying a voltage to said plurality of second electrodes, wherein said voltage changes a surface potential of said transfer region.

2. A charge transfer device according to claim 1, wherein said transfer region of said semiconductor substrate has first impurity regions positioned below said plurality of first electrodes and second impurity regions doped with impurities at high concentration, positioned below said plurality of second electrodes.

3. A charge transfer device according to claim 1, wherein said transfer region of said semiconductor substrate has first impurity regions doped with impurities of one conductivity type and second impurity regions doped with impurities of the other conductivity type, said first impurity regions being positioned below said plurality of second electrodes and said second impurity regions being positioned below said plurality of first electrodes.

4. A charge transfer device according to claim 1, which is a vertical transfer charge coupled device used for a solid state imaging apparatus.

5. A charge transfer device according to claim 1, which is a horizontal transfer charge coupled device used for a solid state imaging apparatus.

6. A charge transfer device comprising:
a semiconductor substrate;
an insulating film formed on said semiconductor substrate;
a first transfer region and a second transfer region both formed in said semiconductor substrate;
a first electrode layer having a high resistance and including a plurality of first electrodes and a first gate electrode, said plurality of first electrodes being formed above said first and second transfer regions with said insulating film sandwiched therebetween and respectively disposed at a predetermined distance, said first gate electrode being formed between said first and second transfer regions so as to cross said plurality of first electrodes;
a plurality of second electrodes having a low resistance and formed above said first and second transfer regions with said insulating film sandwiched therebetween, each of said second electrodes being disposed between said respective adjacent first electrodes and partially overlapping both said respective adjacent first electrodes and said first gate electrode with direct contact;
a first voltage applying means for applying a first voltage to said second electrodes above said first transfer region, said first voltage changing a surface potential of said first transfer region, thereby forming a first charge coupled device to transfer signal charges in a first direction along said first transfer region;
a second voltage applying means for applying a second voltage to said second electrodes above said second transfer region, said second voltage changing a surface potential of said second transfer region, thereby forming a second charge coupled device to transfer signal charges in said first direction along said second transfer region; and
a third voltage applying means for applying a third voltage to said first gate electrode, said third voltage changing a surface potential of a region between said first transfer region and said second transfer region, thereby forming a transfer gate device to transfer signal charges from said first charge coupled device to said second charge coupled device.

7. A charge transfer device according to claim 6, wherein said second electrodes are divided into at least two second sub-electrodes, and said charge transfer device further comprises first sub-electrodes having a high resistance, said first sub-electrodes being formed on said insulating film and partially overlapping both of said two second sub-electrodes with direct contact.

* * * * *